(12) United States Patent
Kim et al.

(10) Patent No.: US 8,830,689 B2
(45) Date of Patent: Sep. 9, 2014

(54) INTERPOSER-EMBEDDED PRINTED CIRCUIT BOARD

(75) Inventors: Jin Gu Kim, Gyunggi-do (KR); Mi Jin Park, Gyunggi-do (KR); Young Ho Kim, Seoul (KR); Seung Wook Park, Gyunggi-do (KR); Hee Kon Lee, Gyunggi-do (KR); Young Do Kweon, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 60 days.

(21) Appl. No.: 13/233,851

(22) Filed: Sep. 15, 2011

(65) Prior Publication Data

US 2012/0067636 A1 Mar. 22, 2012

(30) Foreign Application Priority Data

Sep. 16, 2010 (KR) ........................ 10-2010-0091231

(51) Int. Cl.
| | | |
|---|---|---|
| H05K 7/00 | (2006.01) | |
| H05K 1/11 | (2006.01) | |
| H05K 7/02 | (2006.01) | |
| H01L 23/498 | (2006.01) | |
| H05K 3/46 | (2006.01) | |
| H05K 3/34 | (2006.01) | |

(52) U.S. Cl.
CPC ........ H05K 3/4694 (2013.01); H01L 23/49822 (2013.01); H01L 2224/16227 (2013.01); H01L 2924/15311 (2013.01); H05K 1/112 (2013.01); H05K 2203/041 (2013.01); H01L 23/49827 (2013.01); H01L 23/49816 (2013.01); H05K 3/3436 (2013.01)
USPC ........... 361/760; 361/748; 361/792; 361/809; 174/261

(58) Field of Classification Search
CPC ....... H05K 1/111; H05K 1/112; H05K 1/141; H05K 1/142; H05K 1/144; H05K 1/181; H05K 3/301; H05K 3/368; H05K 3/429; H05K 7/023; H05K 7/08
USPC ......... 361/760, 761, 748, 784, 792, 807–809; 174/260, 261
See application file for complete search history.

(56) References Cited

U.S. PATENT DOCUMENTS

| | | | |
|---|---|---|---|
| 5,148,265 | A | 9/1992 | Khandros et al. |
| 5,148,266 | A | 9/1992 | Khandros et al. |

(Continued)

FOREIGN PATENT DOCUMENTS

| | | |
|---|---|---|
| JP | 2008-041930 | 2/2008 |
| KR | 2010-0037300 A | 4/2010 |

OTHER PUBLICATIONS

Office Action from counterpart Korean Patent Application No. 10-2010-0091231, mailed Nov. 29, 2011, 4 pages.

Primary Examiner — Hoa C Nguyen
(74) Attorney, Agent, or Firm — Bracewell & Giuliani LLP; Brad Y. Chin

(57) ABSTRACT

Disclosed herein is an interposer-embedded printed circuit board, including: a substrate including a cavity formed in one side thereof and having a predetermined height in a thickness direction of the substrate; an interposer disposed in the cavity and including a wiring region and an insulating region; and a circuit layer formed in the substrate and including a connection pattern connected with one side of the wiring region. The interposer-embedded printed circuit board is advantageous in that an interposer is embedded in a substrate, so that the thickness of a semiconductor package can be reduced, thereby keeping up with the trend of slimming the semiconductor package.

7 Claims, 2 Drawing Sheets

(56) References Cited

U.S. PATENT DOCUMENTS

| | | | | |
|---|---|---|---|---|
| 5,475,317 A * | 12/1995 | Smith | | 324/750.05 |
| 5,536,909 A | 7/1996 | DiStefano et al. | | |
| 5,659,952 A | 8/1997 | Kovac | | |
| 6,407,929 B1 * | 6/2002 | Hale et al. | | 361/763 |
| 6,556,453 B2 * | 4/2003 | Figueroa et al. | | 361/763 |
| 6,894,385 B1 * | 5/2005 | Jafari et al. | | 257/724 |
| 7,476,980 B2 * | 1/2009 | Rebibis et al. | | 257/782 |
| 7,613,007 B2 * | 11/2009 | Amey et al. | | 361/763 |
| 2002/0027773 A1 * | 3/2002 | Davidson | | 361/763 |
| 2002/0041489 A1 * | 4/2002 | Fritz | | 361/767 |
| 2002/0053735 A1 * | 5/2002 | Neuhaus et al. | | 257/728 |
| 2003/0219956 A1 * | 11/2003 | Mori et al. | | 438/393 |
| 2004/0183187 A1 * | 9/2004 | Yamasaki et al. | | 257/700 |
| 2005/0280146 A1 * | 12/2005 | Cornelius | | 257/730 |
| 2007/0298603 A1 * | 12/2007 | Rebibis et al. | | 438/613 |
| 2008/0074852 A1 * | 3/2008 | Lee | | 361/749 |
| 2010/0081236 A1 * | 4/2010 | Yang et al. | | 438/119 |
| 2011/0058348 A1 * | 3/2011 | Sakai et al. | | 361/803 |
| 2011/0071397 A1 * | 3/2011 | Wodnicki et al. | | 600/459 |
| 2011/0103807 A1 * | 5/2011 | Cachia et al. | | 399/12 |

* cited by examiner

INTERPOSER-EMBEDDED PRINTED CIRCUIT BOARD

CROSS REFERENCE TO RELATED APPLICATION

This application claims the benefit of Korean Patent Application No. 10-2010-0091231, filed Sep. 16, 2010, entitled "A printed circuit board embedded interposer within", which is hereby incorporated by reference in its entirety into this application.

BACKGROUND OF THE INVENTION

1. Technical Field

The present invention relates to an interposer-embedded printed circuit board.

2. Description of the Related Art

Various technologies are required to realize a printed circuit board in a market which requires semiconductor packages having decreased profiles and a variety of functions.

For example, in the manufacturing of a flip chip ball grid array (FCBGA) package, the electroconductive terminals or lands of semiconductor chips are directly soldered to the lands corresponding to the die bonding region on the surface of a printed circuit board using reflowable solder bumps or balls. In this case, semiconductor chips are functionally connected to other elements of an electronic system by electroconductive channels including substrate traces, and the substrate traces generally serve to transport signals transmitted between semiconductor chips.

However, the performance of semiconductor chips has advanced and the pitch of electrodes has become narrow, whereas the degree to which a printed circuit board can have a fine pitch is limited. Therefore, it gradually has been becoming difficult to directly mount a semiconductor chip in a printed circuit board.

Therefore, technologies for connecting a semiconductor chip with a printed circuit board using an interposer having micro wiring have been proposed. That is, an interposer is disposed between a semiconductor chip having fine pitch and a printed circuit board having wide pitch, thus connecting the semiconductor chip with the printed circuit board.

However, conventionally, since an interposer is mounted on one side of a printed circuit board, a semiconductor package becomes thick, so that the conventional printed circuit board cannot keep up with the trend of slimming the semiconductor package.

SUMMARY OF THE INVENTION

Accordingly, the present invention has been devised to solve the above-mentioned problems, and the present invention intends to provide an interposer-embedded printed circuit board which can realize the slimming of a semiconductor package by embedding an interposer in the printed circuit board and thus reducing the total thickness of the semiconductor package.

An aspect of the present invention provides an interposer-embedded printed circuit board, including: a substrate including a cavity formed in one side thereof and having a predetermined height in a thickness direction of the substrate; an interposer disposed in the cavity and including a wiring region and an insulating region; and a circuit layer formed in the substrate and including a connection pattern connected with one side of the wiring region.

Here, the interposer may be disposed in the cavity such that one side thereof is exposed.

Further, one side of the interposer may be flush with the one side of the substrate.

Further, the interposer-embedded printed circuit board may further include: a bump formed on the other side of the wiring region to connect a semiconductor chip with the interposer.

Further, a passive component may be embedded in one side of the interposer.

Further, a passive component may be embedded in the other side of the interposer.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
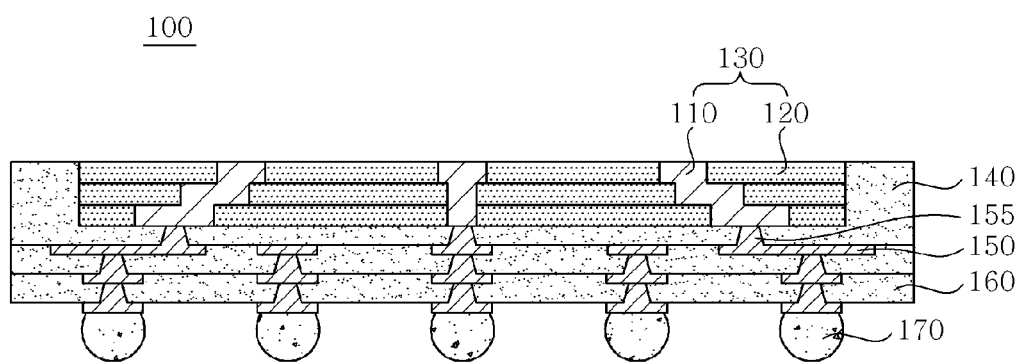
FIG. 1 is sectional view showing an interposer-embedded printed circuit board according to a first embodiment of the present invention.

The objects, features and advantages of the present invention will be more clearly understood from the following detailed description of preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is sectional view showing an interposer-embedded printed circuit board according to a first embodiment of the present invention.

As shown in FIG. 1, the interposer-embedded printed circuit board 100 according to the first embodiment of the present invention includes a substrate 140 including a cavity having a predetermined height in a thickness direction of the substrate 140, an interposer 130 disposed in the cavity of the substrate 140 and including wiring regions 110 and an insulating region 120, and a circuit layer 150 formed in the substrate 140 and including connection patterns 155 connected with one sides of the wiring regions 110.

The substrate 140 may be made of an insulation material which is generally used in printed circuit boards. Examples of the insulation material may include, but are not limited to, epoxy resins, such as prepreg, ABF (Ajinomoto Build up Film), FR-4, BT (Bismaleimide Triazine), etc. Further, the substrate 140 is provided with a cavity in which the interposer 130 will be disposed. However, in order to provide a space for forming the circuit layer 150, the cavity must not entirely penetrate the substrate 140, and, in order to allow one side of the substrate 140 to be flush with one side (exposed side) of the interposer 130, the height of the cavity must be equal to the thickness of the interposer 130.

The interposer 130 serves to connect a semiconductor chip 180 and a printed circuit board 100 which have different pitches and to compensate for the difference between the thermal expansion coefficients (CTE) of the semiconductor chip 180 and the printed circuit board 100. Here, the interposer 130 includes the insulating region 120 made of silicon and the wiring regions 110 connecting the semiconductor chip 180 and the printed circuit board 100. Further, since the interposer 130 is disposed in the cavity, the total thickness of a semiconductor package does not increase, and thus keeping up with the trend of slimming the semiconductor package.

Figure 2:
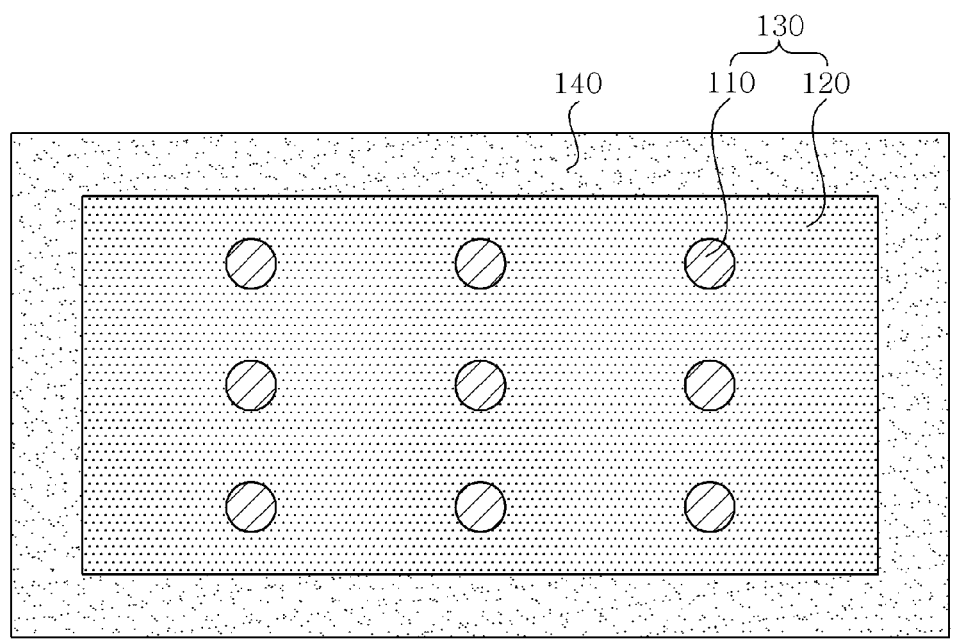
FIG. 2 is plan view showing an interposer-embedded printed circuit board according to a first embodiment of the present invention.

FIG. 2 is plan view showing an interposer-embedded printed circuit board according to a first embodiment of the present invention. Referring to FIG. 2, it can be seen that one side of the interposer 130 is exposed because the interposer 130 is not entirely embedded in the substrate 140. When the interposer 130 on which the semiconductor chip 180 will be mounted is exposed, there is an advantage in that the radiation performance of the interposer 130 can be improved.

Further, as shown in FIG. 1, in order to ensure the structural stability of the entire printed circuit board 100, one side of the interposer 130 may be flush with one side of the substrate 140. Here, the meaning that one side of the interposer 130 is flush with one side of the substrate 140 is not that they are mathematically completely flush with each other but rather includes the notion that manufacturing error may occur.

The circuit layer 150 is formed during a procedure of stacking insulation material layers 160 on the substrate 140. For example, the insulation material layers 160 are stacked on the substrate 140, and then via holes are formed in the stacked insulation material layers 160 using a YAG or $CO_2$ laser, and then a semi-additive process (SAP) or a modified semi-additive process (MSAP) is performed to form the circuit layer 150 including vias.

Further, the circuit layer 150 includes connection patterns 155 connected with the wiring regions 110 of the interposer 130. The connection patterns 155 may be formed in the shape of a via, but the present invention is not limited thereto. The connection patterns 155 may have various shapes.

Meanwhile, the circuit layer 150 includes pads which are exposed to the other side of the substrate 140. The pads are provided thereon with solder balls 170 for connecting the circuit layer 150 with external circuits such as mother boards and the like.

Figure 3:
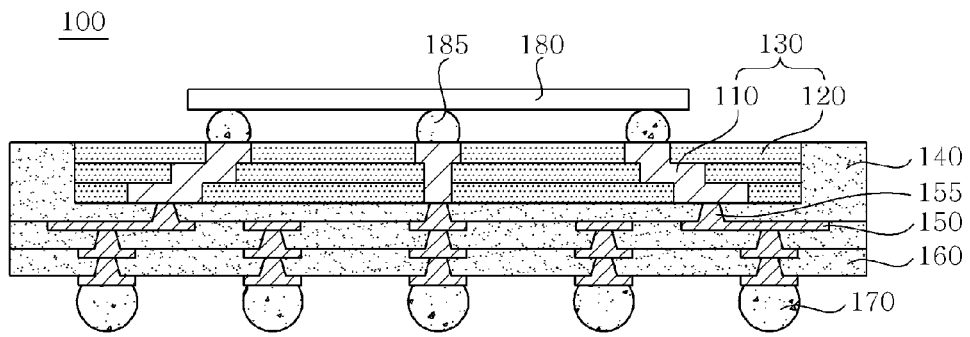
FIG. 3 is a sectional view showing an interposed-embedded printed circuit board mounted with a semiconductor chip according to a first embodiment of the present invention.

FIG. 3 is a sectional view showing an interposed-embedded printed circuit board mounted with a semiconductor chip according to a first embodiment of the present invention.

As shown in FIG. 3, in order to mount a semiconductor chip 180 on the printed circuit board 100 embedded with the interposer 130, bumps 185 are formed on the other sides of the wiring regions 110 (exposed wiring regions 110). That is, the semiconductor chip 180 is connected with the other sides of the wiring regions of the interposer 130 by the bumps 185.

Therefore, since one sides of the wiring regions 110 are connected with the circuit layer 150 and the other sides of the wiring regions 110 are connected with the semiconductor chip 180, the interposer 130 can serve to connect a semiconductor chip 180 and a printed circuit board 100 which have different pitches.

Figure 4:
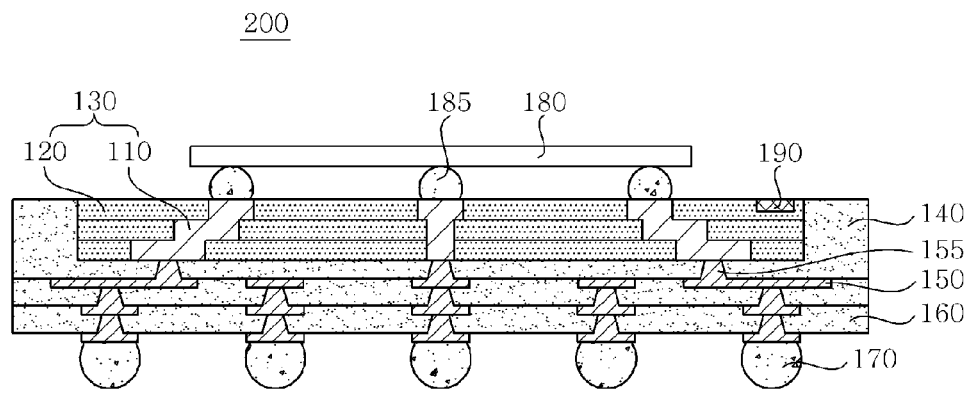
FIG. 4 is a sectional view showing an interposed-embedded printed circuit board mounted with a semiconductor chip according to a second embodiment of the present invention.
Figure 5:
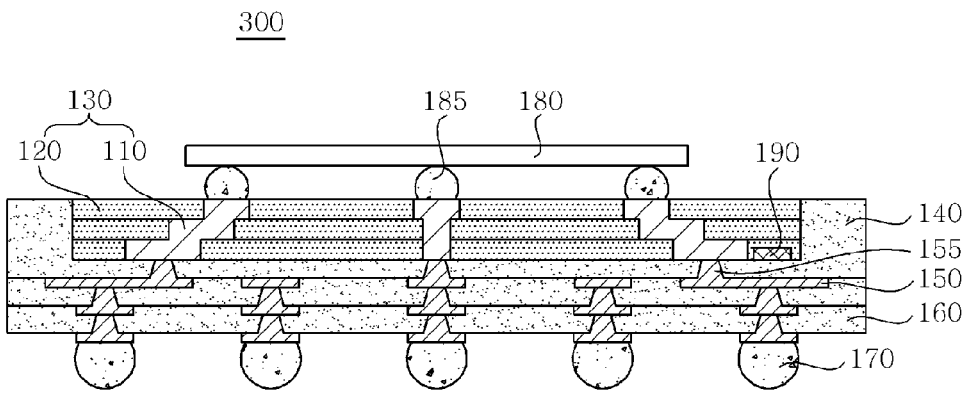
FIG. 5 is a sectional view showing an interposed-embedded printed circuit board mounted with a semiconductor chip according to a third embodiment of the present invention.

FIG. 4 is a sectional view showing an interposed-embedded printed circuit board mounted with a semiconductor chip according to a second embodiment of the present invention, and FIG. 5 is a sectional view showing an interposed-embedded printed circuit board mounted with a semiconductor chip according to a third embodiment of the present invention.

As shown in FIGS. 4 and 5, the most important difference between the interposer-embedded printed circuit boards 200 and 300 according to the second and third embodiments and the above-mentioned interposer-embedded printed circuit board 100 according to the first embodiment is whether or not a passive component 190 is provided therein. Therefore, the interposer-embedded printed circuit boards 200 and 300 according to the second and third embodiments will be described on the basis of the passive component 190, and the description of the interposer-embedded printed circuit boards 200 and 300 that overlaps with that of the interposer-embedded printed circuit board 100 will be omitted.

As shown in FIG. 4, in the interposer-embedded printed circuit board 200 according to the second embodiment, the passive component 190 is embedded in one side (exposed side) of the interposer 130. Here, examples of the passive component 190 may include a resistor, a capacitor, an inductor and the like. Since silicon constituting the interposer 130 has higher mechanical strength than an insulation material constituting the substrate 140, the passive component 190 can be effectively protected. Further, since the passive component 190 is not embedded in the substrate 140 but in the interposer 130, the design freedom of the printed circuit board 200 can be improved.

Meanwhile, as shown in FIG. 5, in the interposer-embedded printed circuit board 300 according to the third embodiment, the passive component 190 is embedded in the other side (the non-exposed side) of the interposer 130. Unlike the above-mentioned interposer-embedded printed circuit board 200 according to the second embodiment, in the interposer-embedded printed circuit board 300 according to the third embodiment, since the passive component 190 is embedded not in one side (the exposed side) of the interposer but in the other side (the non-exposed side) of the interposer 130, the passive component 190 is completely surrounded by the interposer 130 and the substrate 140, and thus the passive component 190 can be more effectively protected. Further, in the printed circuit board 300 according to the third embodiment, if necessary, the electrical connection between the circuit layer 150 and the passive component 190 is also possible.

As described above, the printed circuit board according to the present invention is advantageous in that an interposer is embedded in a substrate, so that the thickness of a semiconductor package can be reduced, thereby keeping up with the trend of slimming the semiconductor package. Further, the printed circuit board according to the present invention is advantageous in that an interposer is embedded in a substrate and simultaneously the top surface of the interposer is exposed, thus improving the radiation performance of the interposer.

Further, the printed circuit board according to the present invention is advantageous in that a passive component is embedded in the interposer, so that the passive component can be physically and chemically protected, and simultaneously the design freedom of the printed circuit board 200 can be improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. An interposer-embedded printed circuit board, comprising:
   a substrate which is a printed circuit board having an insulating resin thereon, the insulating resin including a cavity formed in the top side thereof and having a predetermined height in a thickness direction of the substrate;
   an interposer disposed in the cavity and including a wiring region and an insulating region;
   a circuit layer formed in the printed circuit board and including a connection pattern connected with the wiring region of the bottom side of the interposer; and
   a bump formed on the wiring region of the top side of the interposer to connect a semiconductor chip with the interposer,
   wherein the top side of the interposer is flush with the top side of the substrate,
   wherein the wiring region of the interposer is directly attached to the bump, and
   wherein substrate is corn used of an insulation material and the material of the insulating region in the interposer has higher mechanical strength than the insulation material of the substrate.

2. The interposer-embedded printed circuit board according to claim 1, wherein the interposer is disposed in the cavity such that the top side of the interposer is exposed.

3. The interposer-embedded printed circuit board according to claim 1, wherein a passive component is embedded in the top side of the interposer.

4. The interposer-embedded printed circuit board according to claim 1, wherein a passive component is embedded in the bottom side of the interposer.

5. The interposer-embedded printed circuit board according to claim 1, wherein the poser s composed of silicon.

6. The interposer-embedded printed circuit board according to claim 1, herein the circuit layer includes pads, the pads being exposed to the bottom side of the substrate and providing thereon with solder balls for connecting the circuit layer with external circuits.

7. The interposer-embedded printed circuit board according to claim 1, wherein the interposer is directly attached to the bottom side of the cavity on the substrate.

\* \* \* \* \*